United States Patent [19]

Rosier

[11] Patent Number: 4,612,630

[45] Date of Patent: Sep. 16, 1986

[54] EEPROM MARGIN TESTING DESIGN

[75] Inventor: Brian K. Rosier, Jenkintown, Pa.

[73] Assignee: Harris Corporation, Melbourne, Fla.

[21] Appl. No.: 635,218

[22] Filed: Jul. 27, 1984

[51] Int. Cl.[4] .......................................... G11C 11/40
[52] U.S. Cl. .................................... 365/201; 371/21
[58] Field of Search .................. 371/21; 365/201, 189, 365/200, 230

[56] References Cited

U.S. PATENT DOCUMENTS

| | | | |
|---|---|---|---|
| 3,846,768 | 11/1974 | Krick | 365/201 |
| 4,127,901 | 11/1978 | Horne et al. | 365/205 |
| 4,243,937 | 1/1981 | Multani et al. | 324/158 T |
| 4,267,583 | 5/1981 | Suzuki | 365/201 |
| 4,301,535 | 11/1981 | McKenny et al. | 371/21 |
| 4,393,475 | 7/1983 | Kitagawa | 365/201 |
| 4,543,647 | 9/1985 | Yoshida | 365/201 |

FOREIGN PATENT DOCUMENTS 56-148792 11/1981 Japan .
80/01150 3/1982 PCT Int'l Appl. .

Primary Examiner—Terrell W. Fears
Attorney, Agent, or Firm—Barnes & Thornburg

[57] ABSTRACT

A circuitry and method of testing programmable, variable threshold memory cells by applying a variable voltage above a normal read voltage to the control gate of a high threshold cell to determine the actual high threshold value and applying zero voltage to the control gate of a low threshold cell to determine if the low threshold is of the opposite polarity of the high threshold.

13 Claims, 9 Drawing Figures

READ

ERASE

PROGRAM LOW

MARGIN TEST

PROGRAM VERIFY

| FUNCTION | VDD | VPP | $\overline{W}$ | $\overline{G}$ | 62 | BLPR 48 | SL 49 | CL 51 | WLPR 53 | ER/$\overline{P}$ | SELECTED BYTE LINE | SELECTED PL | SELECTED PH |
|---|---|---|---|---|---|---|---|---|---|---|---|---|---|
| READ | 5 | $5-V_D$ | 5 | 0 | $\leq 5$ | ⊓ | $5-V_D$ | $5-V_D$ | ⊓ | 5 | $<5$ | $5-V_D$ | 0 |
| PROGRAM TO $V_{LT}$ | 5 | 20 | 0 | 5 | $\leq 5$ | 0 | 20 | 0 | 0 | 0 | $20-V_{TN}$ | 0 | 0 |
| ERASE OR PROGRAM TO $V_{HT}$ | 5 | 20 | 0 | 5 | $\leq 5$ | 0 | 20 | 20 | 0 | 5 | 0 | $5-V_D$ | $5-V_{TN}$ |
| ERASE MARGIN TEST | 5 | $\geq 5-V_D$ | 5 | 0 | $\geq 5$ | ⊓ | $\geq 5-V_D$ | $\geq 5-V_D$ | ⊓ | 5 | $<5$ | $5-V_D$ | 0 |
| PROGRAM VERIFY | 5 | $5-V_D$ | 12V | 0 | $\leq 5$ | ⊓ | $5-V_D$ | 0 | ⊓ | 5 | $<5$ | $5-V_D$ | 0 |

FIG. 9

EEPROM MARGIN TESTING DESIGN

BACKGROUND AND SUMMARY OF THE INVENTION

This invention relates to method and apparatus for determining the programming margin of a memory cell of an electronically erasable programmable read only memory (EEPROM).

When an EEPOM is being programmed, a small amount of charge is being transferred to the floating gate of a device in the memory cell. Typically, when a memory cell of an EEPROM is being erased, the small amount of charge which existed on the floating gate is transferred from the floating gate back into the substrate upon which the memory cell is provided. The presence or absence of stored charge changes the threshold of the memory cell between a high threshold voltage ($V_{HT}$), corresponding to an erased memory cell, and a low threshold voltage ($V_{LT}$), corresponding to a programmed memory cell. The cell threshold is the voltage value at which the cell switches on/off or between high and low resistance states or values.

If the value of the threshold voltages of individual cells in the matrix of an EEPROM could be measured, the manufacturer of the matrix would have the ability to determine the threshold voltage margins that exist between cells in erased and programmed conditions, that is, the ability to determine whether data can reliably be read from a particular cell of the EEPROM or not. This, of course, would be highly beneficial in testing the realiability of an EEPROM matrix design, and in testing EEPROMs after manufacture.

Typically, the high threshold value is approximately 8 volts for an erased memory cell and a low threshold value is approximately $-2$ volts for a programmed memory cell. By providing a read signal VPP to the control terminal of the memory cell of approximately 5 volts, the high threshold erase cell will maintain its high resistance state and a low threshold programmed cell will switch to a low resistance state. The output circuitry of the EEPROM will indicate the difference of resistive values of the memory cell in response to the read signal VPP. For programming the variable threshold memory cell, VPP is raised to approximately 20 volts by means of an internal voltage multiplier while VDD remains at 5 V.

It is known that by increasing the voltage on a control gate of a memory cell, an erased high threshold cell can be made to conduct, or switch to low resistance such that it will be interpreted as a programmed cell, rather than as an erased cell. According to an aspect of the present invention, this can be accomplished by forcing the internal voltage (VPP) supply to a higher voltage than the supply voltage VDD from an external control pin on the part. By coupling an external control pin to VPP by a separate diode, the VPP supply is enabled to follow the control pin voltage independent of VDD. Since the value of the external voltage being applied to the control pin causes an erased cell to read as a programmed cell, the threshold voltage or the so-called "erase margin" of the cell can be measured.

This high threshold test was developed for electrically programmable read only memories (EPROMS) and have been used also on electrically erasable and programmable read only memories (EEPROMS).

When an EEPROM cell is programmed, it is preferable that the cell behave as a depletion mode device, that is, having a $V_{LT}$ which is negative or less than zero volts. In order to determine the program margin of a cell under such conditions, the control line would have to be forced below zero volts. Because this cannot be done with the cell in the read condition, the present invention proposed a "worst case" read/program verify scheme. Pursuant to the broadest aspect of the invention, by decoding inputs from external pins, logic is used to switch the matrix control line from the control pin supply to ground. This permits the memory cell to be read under the worst case condition, namely the voltage on the control line is zero volts. Under this condition, a well programmed cell having a $V_{LT}$ below zero will continue to read as a low resistance programmed cell while a poorly programmed cell having a $V_{LT}$ greater than zero will read as high resistance erased cell.

According to this invention, a method of testing a memory cell is provided. For the memory cells programmed to a first logic state having a high threshold voltage and a high resistance, a variable voltage is applied to the control line of the memory cell and the resistance of the first logic state cells are monitored to determine the voltage at which the cell switches from a high to a low resistance state as an indication of the actual high voltage threshold for the first logic state cell. For second logic state cells having low threshold values, a zero or ground voltage is applied to the control line of the second logic state cells and the resistance state is monitored to determine if the cell has a threshold voltage less than zero. The variable voltage to determine the first logic state exceeds the normal read control signal.

Further according to the invention, an apparatus is provided for testing the margin of plurality of programmable threshold memory cells. In addition to the addressing circuit and the resistance state monitoring circuit, the invention includes a control circuit connected to the control terminals of the memory cells and responsive to mode signals for applying a read control signal of variable voltage signal of a first polarity and a zero voltage signal to the terminals of the cells. The control circuit is responsive to read control signal high threshold test mode signal and a low threshold test mode signal to apply the appropriate voltages to the control gate respectively. A first voltage terminal of the control circuit receives the variable voltage signal and the read control signal from separate inputs. A second voltage terminal is connected to the zero voltage signal.

Other objects, advantages and novel features of the present invention will become apparent from the following detailed description of the invention when considered in conjunction with the accompanying drawings.

BRIEF DESCRIPTION OF THE DRAWINGS

FIG. 9 is a table of voltages at nodes of FIGS. 1–3 for various operational functions.

DETAILED DESCRIPTION OF THE DRAWINGS

Figure 1:
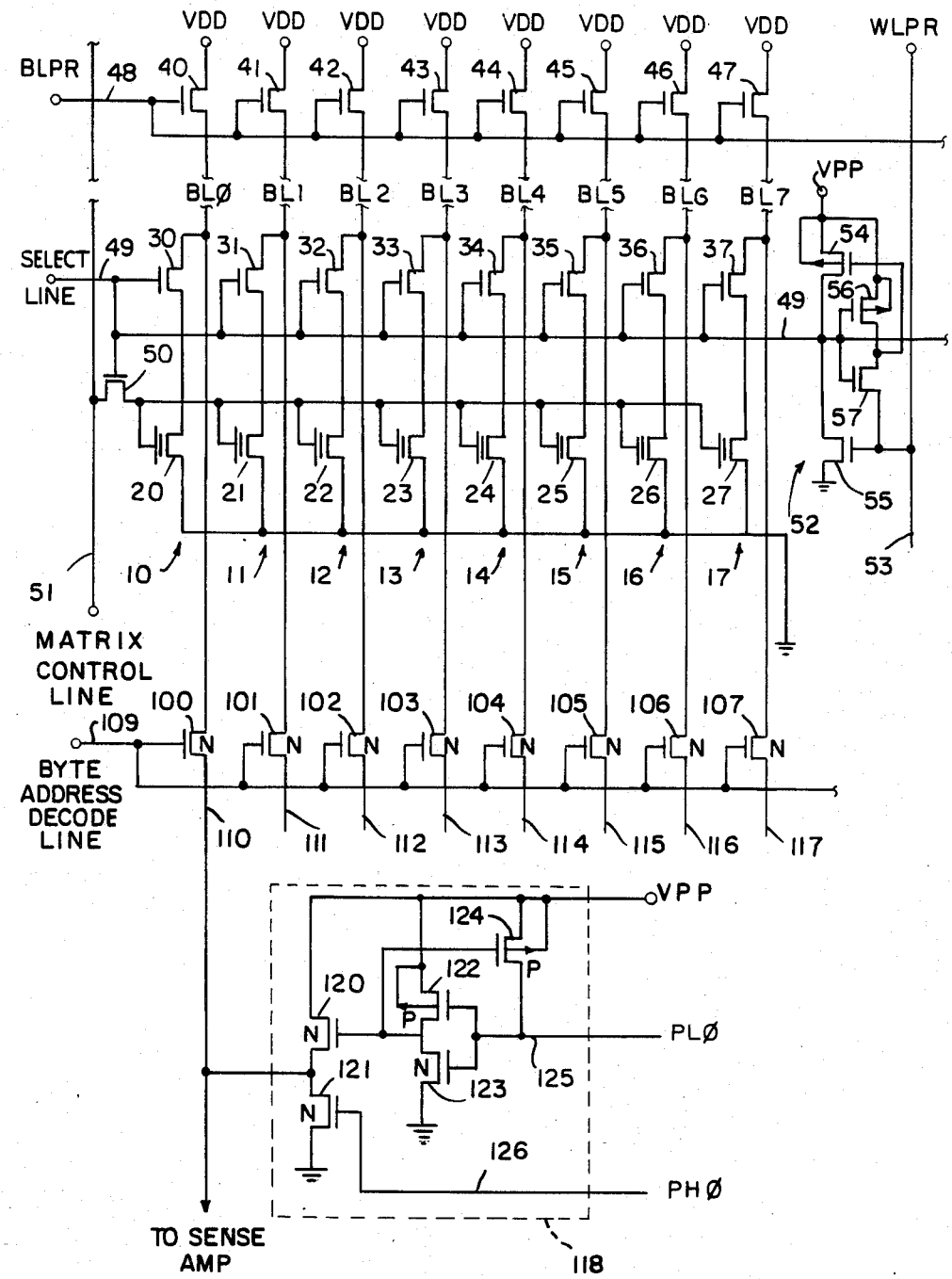
FIG. 1 illustrates the organization of memory cells for holding a byte in a memory matrix.

A memory array capable of holding a byte or eight bits of information is illustrated in FIG. 1. Eight memory cells 10–17 include dual gate variable threshold transistors 20–27 respectively and selecting transistors 30–37 respectively having their source and drains connected in series between the matrix ground line and bit lines $BL_0$–$BL_7$. Also connected to the bit lines are bit line precharge transistors 40–47 respectively having their drains connected to the supply voltage VDD and their gates connected to Bit line precharge (BLPR) 48. The select line 49 for selecting a row of cells is connected to the gates of the address or selecting transitors 30–37 as well as an enable transistor 50 which connects the matrix control line 51 to the gates of the variable threshold cell transistors 20–27. A latch or precharge pull-down pull device 52 is also connected to the select line 49 as well as the word line precharge (WPLR) 53. The latch 52 includes transistors 54, 55, 56 and 57.

Bit line precharge (BLPR) and word line precharge (WLPR) are clock pulses which are internally generated from Input Transition Detection circuitry (not shown) and are used to set up the proper conditions in the matrix for a Read Cycle.

WLPR signal pulses high for a short period of time during which time it pulls the select line 49 to ground by device 52 in order to aid the select line decoder in de-selecting the previously selected select line to insure that only one select line is high at one time.

BLPR signal pulses high for a short period of time to pull the bit lines high through N-channels 40–47.

Also connected to each bit line BL are column transmission gates 100 through 107 having a byte address decode line 109 connected to their gates. Connected to each of the bit lines BL between the column transmission gate and the sense amplifier is an individual programming select circuit 118, only one of which is shown. The programming select circuit 118 includes an N-channel device 121 connected to the bit line BL and ground and is responsive to a high program high threshold or erase signal PH on its gate line 126 to ground the bit line BL. N-channel device 120 connects the supply VPP to the bit line BL in response to a low program low threshold signal PL on input line 125 which is inverted by inverter P122/N123. A latch P124 has its gate connected to the output of inverter P122/N123 to keep N120 off after a high signal on PL by pulling it up to VPP. This disconnects the bit line BL from VPP except when selected. The input sgnals PL and PH are used to select the bits to be programmed to a low threshold or erased to a high threshold.

The circuit of FIG. 1 is an example of one type of memory cell matrix or array including variable threshold devices used for EEPROM. Since this circuit is fairly standard, only a brief description of its operation will be described before discussing the remainder of the invention. Initially, the Bit Line Precharge 48 is high turning on transistors 40–47 to provide the supply signal VDD on the bit lines $BL_0$ through $BL_7$ respectively. Activation of the select line 49 turns on a row of transistors 30–37 and by applying the appropriate control signal to matrix control line 51, the operation of the memory cell transistors 20–27 are provided.

For example, for a read operation, a signal between the upper and lower threshold of the variable threshold devices 20–27 is applied and only those devices which have a low threshold value will provide a low resistance state and provide a series connection between those transistors and the select line activated transistors 30–37 to bring the respective bit lines $BL_0$–$BL_7$ to ground. The variable threshold transistors 20–27 which have a high threshold value remain in their high resistance state and these lines will not be pulled down to ground and remain at the high supply voltage signal VDD. Sense amplifiers and column decode logic (not shown) monitor and select the appropriate bit lines $BL_0$ through $BL_7$.

For programming, the select line 49 and transistors 30–37 operate in the same manner. The difference is the signal applied to the matrix control line 51 and the supply voltage VPP or ground is supplied to the bit lines through the column transmission gates 100–107 and transistor 120 or 121 depending on the state of the programming signal PL and PH which are generated separately so that both transistors 120 and 121 will be turned off during a read operation. Also note that through the byte decoder, the VPP signal is applied to the properly selected byte address decoder line 109 either during a read or programming operation. The variable threshold transistors 20–27 are programmed from the high threshold value to a low threshold value by providing a substantially greater voltage than VDD and a substantially greater voltage than the read VPP to the matrix in order to store charge on the floating gate 63 and thereby reduce the threshold value. This high VPP is produced by a voltage multiplier illustrated in FIG. 2 if using a common pin, or by a separate VPP input pin. The voltage multiplier 63 has no effect on VPP as long as the oscillator is disabled. When the oscillator is enabled, the alternate clocking of adjacent stages transfer charge to the node VPP which increases by charge pumping.

As discussed previously, preferably the low threshold value of the cell is a negative threshold value such that the devices go into depletion mode operation. It should be noted that all the transistors described so far except transistors 54 and 55 are N-channel devices and, thus, the description of the voltage is VDD and the matrix control line are positive with respect to the ground. Transistors may all be P-channel devices and therefore the voltage VDD and the matrix control voltage would be negative with respect to ground and the high and low threshold values would be in the negative sense.

Figure 2:
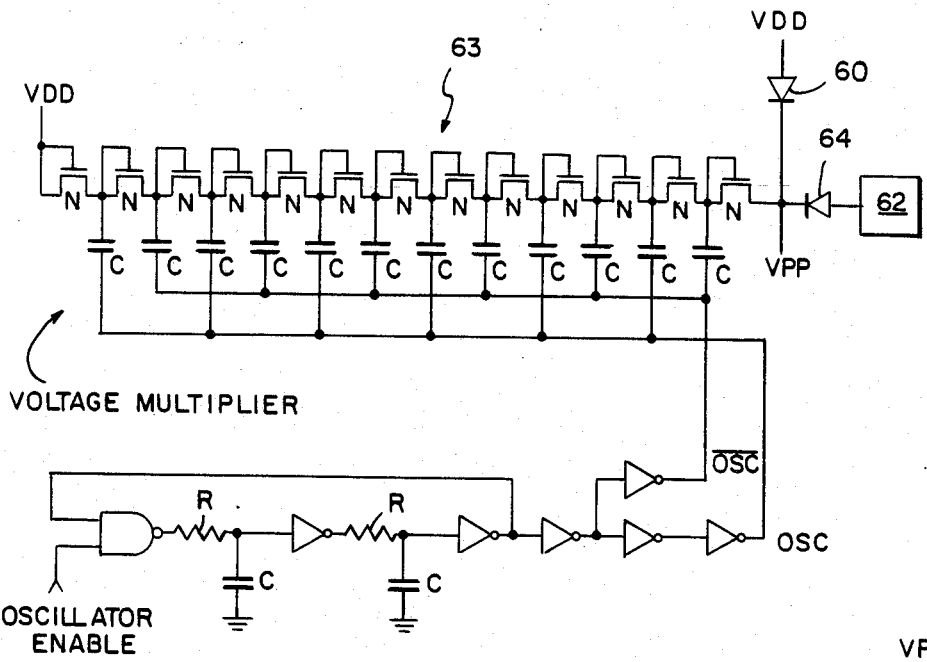
FIG. 2 illustrates a scheme by which the VPP supply can be forced higher than one diode drop below the VDD supply.

As will be explained below, the testing procedure of the present invention requires the ability to raise the matrix control line 51 to a greater voltage than the read voltage to determine the exact high threshold value. As illustrated in FIG. 2, the matrix control line voltage VPP is generally tied directly to the supply voltage VDD by a diode 60. Thus, during a normal read or a program verify, no additional input pin is needed to generate VPP. A second external pin 64 is also connected to the voltage terminal VPP through diode 64. The pin 62 offers the availability of a voltage input to the voltage terminal VPP other than one diode drop from VDD. The variable voltage supply which will be described below can be provided on pin 62 which can be any pin that is not required to be held low during a read operation. The diode 64 is not forward biased until the variable voltage signal applied to pad 62 is above VDD. This allows the VPP to follow the input on 62 when it rises above VDD. As will be explained more fully below, the voltage signal VPP, when it is one voltage drop below VDD, is used as the read signal to the matrix control line 51 and when it is more than one diode drop below VDD from the variable voltage input 62, the VPP follows the variable signal on matrix control line 51 so as to switch high threshold erased devices to their lower resistance state. This switching may be monitored and the voltage at which the resistance switches would indicate the exact high threshold voltage of the erased cell. This is used to determine the erased margin.

As discussed previously, it is preferred that the low threshold or programmed memory cell is programmed into depletion mode or having a threshold below zero. In order to determine those devices which are in the depletion mode, the control line 51 would have to be forced below zero volts and the switching point monitored which in this case would be from a low resistance to a high resistance value. This is not possible in present structured cell since this requires a signal of an opposite polarity than VDD.

Figure 3:
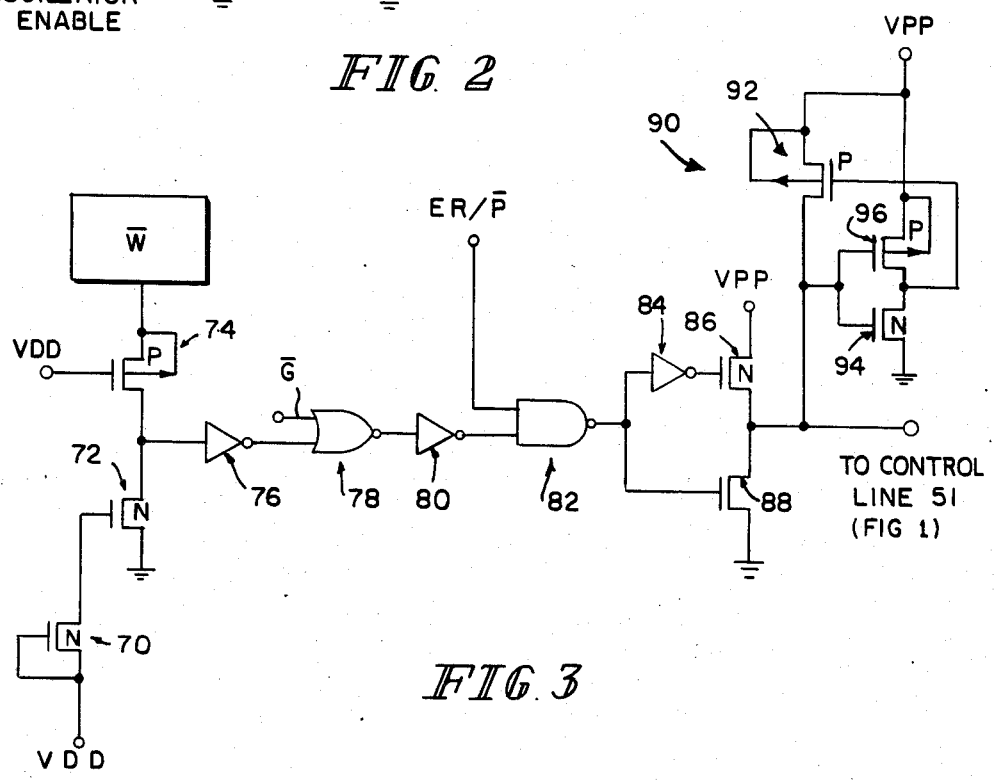
FIG. 3 illustrates the control logic for the control line of a matrix of FIG. 1 incorporating the principles of the present invention.

A control system as illustrated in FIG. 3 produces voltages capable of reading the programmed cells, programming cells, identifying the specific high threshold voltage of a high threshold unprogrammed or erased cell and determining which programmed or low threshold voltage cells have a threshold voltage below zero volts.

With reference to FIG. 3, an N-channel FET 70 has its gate coupled to source VDD. The drain of FET 70 is coupled to a source VDD of positive potential and the source is coupled to the gate of an N-channel FET 72. The source of FET 72 is coupled to ground and the drain is coupled to the drain of a P-channel FET 74. The source of FET 74 is coupled to the external W pin (WRITE). The gate of FET 74 is coupled to VDD. The joined drains of FET 72 and FET 74 are coupled through an inverting amplifier 76 to an input terminal of a NOR gate 78. The purpose of devices 70, 72 and 74 in FIG. 3 is to provide a logic high signal to the input of inverter 76 when input pin W is raised above VDD to a voltage of approximately 12 volts. Pin W need not be a dedicated pin, it could be any input pin not required to be low during read. The other input terminal of NOR gate 78 is coupled to a source of OUTPUT ENABLE signal $\overline{G}$. The output terminal of NOR gate 78 is coupled through an inverter 80 to an input terminal of a NAND gate 82. The other input terminal of NAND gate 82 is coupled to a source of ERASE READ/PROGRAM (ER/$\overline{P}$) signal. The output terminal of NAND gate 82 is coupled through an inverting amplifier 84 to the gate of an N-channel FET 86. The output terminal of NAND gate 82 is also coupled to the gate of an N-channel FET 88. The drain of FET 88 is coupled to the source of FET 86 and the source is coupled to ground. The drain of FET 86 is coupled to the VPP supply. The joined source of FET 86 and drain of FET 88 are coupled to the matrix control line 51 (FIG. 1).

A latch 90 is also coupled to the control line 51. The latch 90 includes a P-channel FET 92, the source of which is coupled to the VPP supply, and the drain of which is coupled to control line 51. The gate of FET 92 is coupled to an output of an inverter formed by an N-channel FET 94 and a P-channel FET 96 and whose source-drain paths are connected between VPP and ground. The input of the inverter gates of FETs 94, 96 are coupled to the control line 51.

Figure 4:
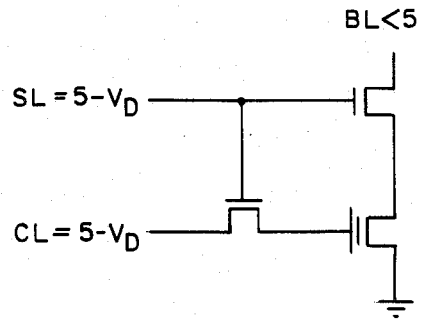
FIG. 4 illustrates a selected memory cell during a read.

The operation of the control circuit of FIG. 3 will now be described. For read operation, the W pin is at a logic input high level (2.0 volts to VDD) which keeps P-channel device 74 off and allows N-channel 72 to maintain a low input to inverter 76. The output of 76 will be high which forces the output of NOR device 78 to be low. This forces the output of inverter 80 to be high which along with the ER/$\overline{P}$ signal (which is high during read) forces the output of NAND device 82 low. This turns off transistor 88 and turns on transistor 86 via inverter 84 to provide VPP to control line 51. As discussed above, VPP during read operation is one diode drop below VDD as shown from FIG. 2. A selected cell having a 5-VD voltage its select line SL 49 and matrix control line CL 51 and less than 5 volts on its bit line BL is shown in FIG. 4.

Figure 5:
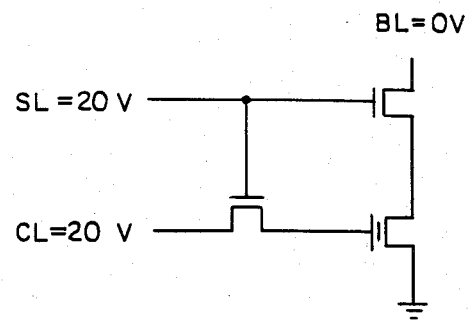
FIG. 5 illustrates a selected memory cell during an erase programming to a high threshold.

For programming, the G (OUTPUT ENABLE) signal is high which forces the output of NOR 78 low and the output of inverter 80 high. To erase (program to a high threshold) the cell, the ER/$\overline{P}$ signal is held high which forces the output of NAND 82 low allowing the control line 51 to follow VPP which would be internally multiplied to approximately 20 volts. Also, the programming signals PL and PH for the selected cell are high during erase so that the bit lines will be held to zero volts. This sets up the condition that the selected memory cells will have zero volts on their bit lines BL, approximately 20 volts on their select lines 49 and $(20 - V_{TN})$ volts on their control lines 51 as shown in FIG. 5. The non-selected cells will have $(20 - V_{TN})$ volts on their bit line.

Figure 6:
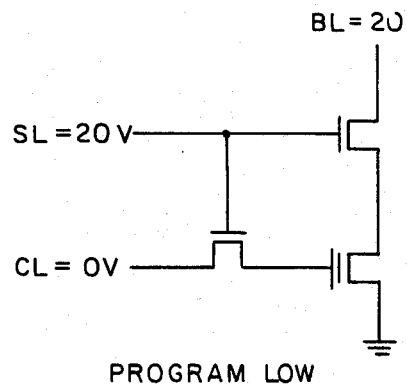
FIG. 6 illustrates a selected memory cell during programming to a low threshold.

When the ER/$\overline{P}$ signal goes low, the output of NAND 82 goes high. This turns off transistor 86 and turns on transistor 88 which pulls the control line to ground. At this time, the programming signals PL and PH will go low on those bits which are to be programmed to a low threshold. The bits to be programmed will have their Bit Lilnes BL pulled toward VPP (20 v) or $20 - V_{TN}$ through N-channel 120 of the column transmission gate and the cells to be maintained at a high threshold will have their bit lines at O as shown in FIG. 6.

Figure 7:
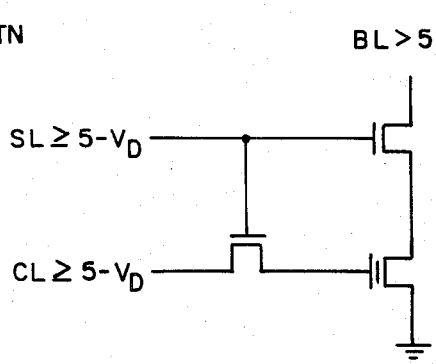
FIG. 7 illustrates a selected memory cell during margin testing.

For measuring the upper threshold value or margin testing, the same conditions are described for the read operation exist on the circuitry in FIG. 3 such that NAND 82's output is low. This allows the control line 51 to follow VPP through P-channel 92. In this case as discussed above, VPP is an increasing variable voltage signal above the read VPP which allows the matrix control line 51 to rise high enough to exceed the threshold value of the erased high threhold device. Once this voltage is exceeded, the memory cell changes states from its high to its low resistance for margin testing states which is monitored by the output circuitry. A selected cell is illustrated in FIG. 7.

Figure 8:
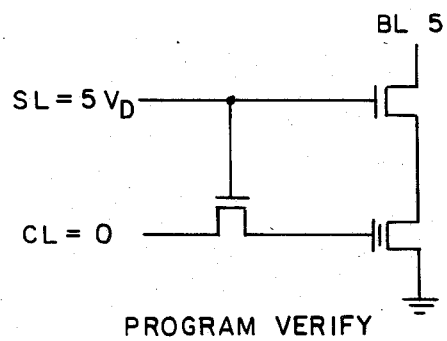
FIG. 8 illustrates a selected memory cell during a progam verify.

To verify that a cell has been properly programmed to the low threshold value or to assure that the threshold value is negative and that the device are in the depletion mode, the W pin is raised to approximately 12 volts which turns on device 74 and allows the input of inverter 76 to be pulled high. The output of inverter 76 is low which, along with a G signal being low, forces the output of NOR 78 high. This forces the output of inverter 80 low causing the output of NAND 82 high. This turns on N-channel 88 and, thus, pulls the control line 51 to ground. Transistor 88 is on bringing the control line 51 to ground. By holding the control line to ground, all programmed transistors which have a threshold value less than zero are in a depletion mode and, thus, will have a low resistance value. All programmed cells which have a low but positive threshold will remain in their high resistance state and this will also be detected. As is well known, the latch 90 follows the signal on line 51 and latches it either to ground or to VPP. A selected cell for program verify is illustrated in FIG. 8.

The Table of FIG. 9 shows the voltages at various nodes for the different modes of operation.

The method and apparatus as discussed herein apply to EEPROMs built in P-type substrates (NMOS or N-well CMOS) or devices in which isolation from the substrate is possible. In systems in which negative voltages are required for program or erase, the method and apparatus herein described would apply if the voltage polarities discussed herein were reversed.

From the preceding description of the preferred embodiments, it is evident that the objects of the invention are attained, and although the invention has been described and illustrated in detail, it is to be clearly understood that the same is by way of illustration and example only and is not to be taken by way of limitation. The spirit and scope of the invention are to be limited only by the terms of the appended claims.

What is claimed is:

1. A method of testing a plurality of programmable read only memory cells each of which have a first logic state and a high voltage threshold or a second logic state and a low voltage threshold comprising:
    applying a variable voltage of a first polarity to a cell programmed to said first logic state and monitoring the resistance state of the first logic state cell to determine the actual high voltage threshold of said first logic state cell; and
    applying a zero voltage to a cell programmed to said second logic state and monitoring the resistance state of the second logic state cell to determine if its low voltage threshold is a second polarity.

2. A method of testing according to claim 1 wherein said variable voltage is higher than a read voltage applied to a cell during a normal read cycle.

3. A method of testing according to claim 2 wherein said cells each include a control terminal and said read voltage, said variable voltage and said zero voltage are applied to said control terminal of said cells.

4. A method of testing according to claim 1, wherein each cell includes a control terminal and including a control means for providing control voltages to said control terminal of each cell for reading and high and low threshold testing in response to control mode signals, and wherein the method includes applying a high threshold test mode signal and low threshold test test mode signal during application of said variable voltage and zero voltage respectively.

5. A method of testing according to claim 4 wherein said cell includes a stored charge, variable threshold transistor.

6. A programmable read only memory comprising:
    a plurality of programmable threshold memory cell, each having a control input, a select input and an output;
    means connected to said cells select input for addressing said memory cells;
    means connected to said cells output for monitoring the resistance state of said addressed memory cells; and
    control means connected to said control input of said memory cells and responsive to mode signals for applying a read control signal to said control input in response to a read mode signal, applying a variable voltage signal of a first polarity to said control input to measure a high voltage threshold of a cell programmed to have a high threshold in response to a high threshold test mode signal, and applying a zero voltage signal to said control input to determine if a low voltage threshold of a cell programmed to a low voltage threshold has a low voltage threshold of a second polarity in response to a low threshold test mode signal.

7. A programmable read only memory according to claim 6 wherein said control means includes a first voltage terminal and a second voltage terminal, means for supplying said read control signal to said first terminal, means for supplying said variable voltage signal to said first terminal, means for supplying said zero voltage signal to said second terminal, and said control means applies the voltage on said first terminal to said control input in response to a read mode signal or high threshold test mode signal and applies the voltage on said second terminal to said control input in response to a low threshold test mode signal.

8. A programmable read only memory according to claim 7 wherein said read supply means includes a first diode connected between said first terminal and a memory supply terminal, and said variable voltage supply means includes a second diode connected between said first terminal and an external pin which receives a variable voltage signal.

9. A programmable read only memory according to claim 8 wherein said second diode becomes forward biased and said first diode becomes reversed biased when said variable voltage exceeds the voltage at said memory supply.

10. A programmable read only memory according to claim 6 wherein each cell includes a dual gate field effect transistor, one of said gates floats and the other gate is connected to said control input.

11. A programmable read only memory according to claim 6 wherein said addressing means includes means for connecting said output of addressed memory cells to said monitoring means during said read and test modes and means connected to said cell output for applying a selected voltage to said output of an addressed cell during programming to high or low voltage threshold modes.

12. A programmable read only memory according to claim 6 wherein said addressing means includes a first switch means in series with said control input of said cells and a second switch means in series with said output of said cells for connecting said cells to their control input and outputs in response to address signals.

13. A programmable read only memory according to claim 12 wherein said addressing means further includes means connected to said cell output for applying a selected voltage to said output of selected cells during programming to high or low voltage threshold modes.

* * * * *